US012812871B2

(12) United States Patent
Lin et al.

(10) Patent No.: US 12,812,871 B2
(45) Date of Patent: Nov. 24, 2026

(54) SEMICONDUCTOR MEMORY STRUCTURE AND METHOD FOR FORMING THE SAME

(71) Applicant: TAIWAN SEMICONDUCTOR MANUFACTURING COMPANY LTD., Hsinchu (TW)

(72) Inventors: Po-Ting Lin, Taichung City (TW); Chung-Te Lin, Tainan City (TW); Hai-Ching Chen, Hsinchu City (TW); Yu-Ming Lin, Hsinchu City (TW); Kuo-Chang Chiang, Hsinchu City (TW); Yan-Yi Chen, Taipei City (TW); Wu-Wei Tsai, Taoyuan City (TW); Yu-Chuan Shih, Hsinchu City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 567 days.

(21) Appl. No.: 18/314,811

(22) Filed: May 9, 2023

(65) Prior Publication Data

US 2024/0381659 A1 Nov. 14, 2024

(51) Int. Cl.

| | |
|---|---|
| ***H10D 99/00*** | (2025.01) |
| ***H10B 51/30*** | (2023.01) |
| ***H10D 30/67*** | (2025.01) |
| ***H10D 30/69*** | (2025.01) |
| ***H10D 64/68*** | (2025.01) |

(52) U.S. Cl.
CPC ......... *H10B 51/30* (2023.02); *H10D 30/6755* (2025.01); *H10D 30/701* (2025.01); *H10D 64/689* (2025.01); *H10D 99/00* (2025.01)

(58) Field of Classification Search
CPC .. H10B 51/30; H10D 30/6755; H10D 30/701; H10D 64/689; H10D 99/00; H10D 64/033
USPC ........................................................ 257/76
See application file for complete search history.

(56) References Cited

U.S. PATENT DOCUMENTS

2003/0027360 A1* 2/2003 Hsu ..................... H10D 64/671 257/E21.208
2011/0075467 A1* 3/2011 Hong ..................... G11C 11/22 257/295
2013/0037793 A1* 2/2013 Pan .................... H10D 30/6757 438/285
2013/0335312 A1* 12/2013 Sasagawa ............ G02B 26/001 257/E33.044
2014/0151682 A1* 6/2014 Saito .................. H10D 30/6755 257/43
2014/0167038 A1* 6/2014 Ahn ................... H10D 30/6755 257/43
2014/0252355 A1* 9/2014 Katoh ................ H10D 30/6713 257/43

(Continued)

*Primary Examiner* — Sheikh Maruf
(74) *Attorney, Agent, or Firm* — WPAT LAW; Anthony King

(57) ABSTRACT

A semiconductor memory structure includes a gate structure, a ferroelectric layer over the gate structure, a channel layer over the ferroelectric layer, an intervening structure between the ferroelectric layer and the channel layer, and a source structure and a drain structure separated from each other over the channel layer. A thickness of the intervening structure is less than a thickness of the channel layer and less than a thickness of the ferroelectric layer. The channel layer and the intervening structure include different materials.

20 Claims, 9 Drawing Sheets

(56) References Cited

U.S. PATENT DOCUMENTS

| | | | | |
|---|---|---|---|---|
| 2016/0190013 | A1* | 6/2016 | Chang | H10D 84/0135<br>438/585 |
| 2016/0190328 | A1* | 6/2016 | Yang | G02F 1/1368<br>257/43 |
| 2016/0268271 | A1* | 9/2016 | Mueller | H10B 51/00 |
| 2016/0315201 | A1* | 10/2016 | Lee | H10D 30/6713 |
| 2017/0110490 | A1* | 4/2017 | Liu | G03F 1/38 |
| 2018/0006129 | A1* | 1/2018 | Xing | H10B 51/00 |
| 2018/0175201 | A1* | 6/2018 | Wang | H10D 30/024 |
| 2018/0315619 | A1* | 11/2018 | Xu | H10D 64/62 |
| 2019/0115444 | A1* | 4/2019 | Bentley | H10D 30/024 |
| 2019/0198638 | A1* | 6/2019 | Van Houdt | H10D 30/024 |
| 2019/0296122 | A1* | 9/2019 | Ino | H10B 51/20 |
| 2019/0386014 | A1* | 12/2019 | Doyle | H10B 51/30 |
| 2020/0006572 | A1* | 1/2020 | Sharma | H10D 99/00 |
| 2020/0105623 | A1* | 4/2020 | Chu | H10D 84/038 |
| 2020/0303417 | A1* | 9/2020 | Teo | H10D 30/6758 |
| 2020/0328287 | A1* | 10/2020 | Chen | H10D 30/701 |
| 2020/0411072 | A1* | 12/2020 | Zhang | H10B 51/20 |
| 2020/0411692 | A1* | 12/2020 | Dewey | H10D 84/08 |
| 2021/0066627 | A1* | 3/2021 | Cheng | H10D 30/6735 |
| 2021/0159340 | A1* | 5/2021 | Song | H10D 30/797 |
| 2021/0376107 | A1* | 12/2021 | van Dal | H10D 64/689 |
| 2022/0246766 | A1* | 8/2022 | Manfrini | H10B 51/30 |
| 2022/0271046 | A1* | 8/2022 | Huang | H10B 51/30 |
| 2022/0293591 | A1* | 9/2022 | Price | H01L 21/02565 |
| 2022/0344513 | A1* | 10/2022 | Huang | H10D 30/701 |

* cited by examiner

SEMICONDUCTOR MEMORY STRUCTURE AND METHOD FOR FORMING THE SAME

BACKGROUND

Many modern electronic devices include non-volatile memory. Non-volatile memory is electronic memory that is able to store data both when powered and also in the absence of power. A promising candidate for next-generation non-volatile memory is ferroelectric random-access memory (FeRAM). FeRAM has a relatively simple structure and is compatible with complementary metal-oxide-semiconductor (CMOS) logic fabrication processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
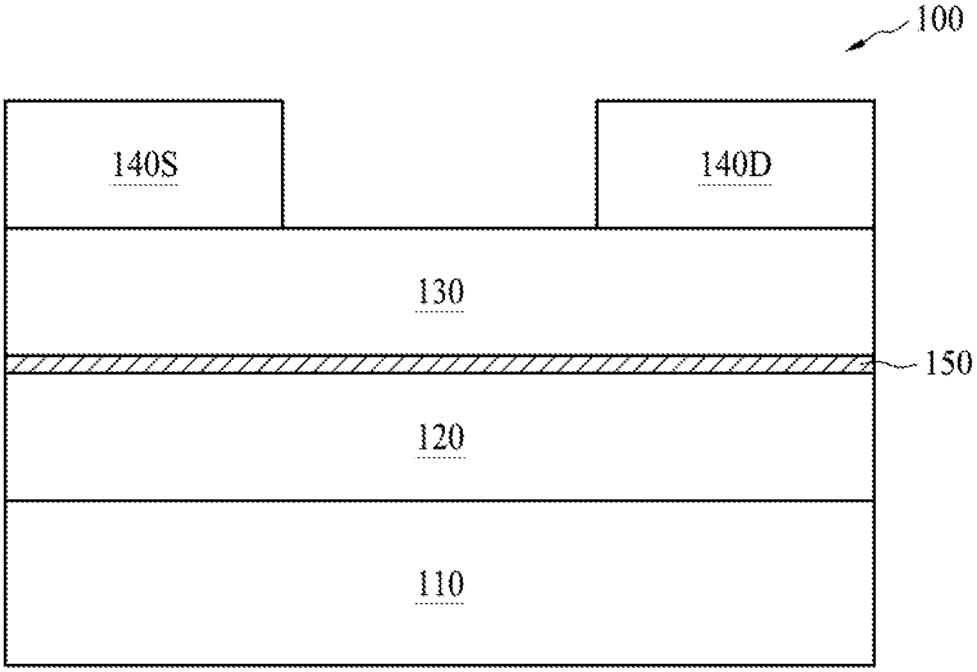
FIG. 1 is a schematic cross-sectional view illustrating a semiconductor memory structure according to aspects of the present disclosure in one or more embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper,” “on” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as “first,” “second” and “third” describe various elements, components, regions, layers and/or sections, these elements, components, regions, layers and/or sections should not be limited by these terms. These terms may be only used to distinguish one element, component, region, layer or section from another. The terms such as “first,” “second” and “third” when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms “substantially,” “approximately” or “about” generally mean within a value or range that can be contemplated by people having ordinary skill in the art. Alternatively, the terms “substantially,” “approximately” or “about” mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms “substantially,” “approximately” or “about.” Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

A ferroelectric field-effect transistor (FeFET) device is a type of ferroelectric random access-memory (FeRAM) device including a ferroelectric material arranged between a conductive gate structure and a channel region disposed between a source region and a drain region. During operation of a FeFET device, an application of a gate voltage to the gate structure will generate an electric field that causes a dipole moment to form within the ferroelectric material. Depending on a value of the gate voltage, a direction of the dipole moment (i.e., a polarization) may be one of two opposing directions. Since a threshold voltage (e.g., a minimum gate-to-source voltage that forms a conductive path between the source region and the drain region) of a FeFET device is dependent upon the polarization within the ferroelectric material, the different polarizations effectively split the threshold voltage of the FeFET device into two distinct values corresponding to different data states.

For example, in an n-type FeFET (e.g., a FeFET device having a channel region with an n-type doping), a positive gate voltage will form an electric field that gives a ferroelectric material a first polarization pointing towards the channel region and that causes electrons to accumulate within the channel region. The electrons will reinforce the first polarization within the ferroelectric material and give the FeFET device a first threshold voltage corresponding to a first data state (e.g., a logical “1”). Alternatively, a negative gate voltage will form an electric field that gives the ferroelectric material a second polarization pointing towards the gate structure and that causes holes to accumulate within the channel region. The holes will reinforce the second polarization within the ferroelectric material and give the FeFET device a second threshold voltage corresponding to a second data state (e.g., a logical “0”). The difference between the first threshold value and the second threshold value defines a memory window of the FeFET device (e.g., corresponding to a difference of threshold voltages of the first and second data states).

The channel region of a FeFET device may include a semiconductor material (e.g., silicon, germanium, etc.). However, it has been appreciated that using an oxide semiconductor for a channel region of a FeFET device allows the FeFET device to achieve a good performance (e.g., a high endurance, low access times, etc.). It has also been appreciated that a memory window of a FeFET device using an oxide semiconductor is relatively small. This is because the oxide semiconductor is not able to accumulate large numbers of different types of charge carriers (e.g., holes and electrons). For example, while a channel region using an n-type oxide semiconductor can accumulate electrons to reinforce a polarization within a ferroelectric material when a positive gate voltage is applied to a gate structure, the n-type oxide semiconductor cannot also accumulate holes to reinforce the polarization within the ferroelectric material when a negative gate voltage is applied to the gate structure. Therefore, a negative gate voltage applied to the gate structure will cause the ferroelectric material to polarize; however, when the negative gate voltage is removed, the ferroelectric material will revert to a remnant polarization. The remnant polarization will reduce the memory window of the FeFET device (e.g., to about half that of a FeFET device having a channel region that is a semiconductor material) and also reduce the endurance of the FeFET device.

The present disclosure therefore provides a semiconductor memory structure and a method for forming the same. In some embodiments, the semiconductor memory structure provides an ultra-thin structure between the channel layer and the ferroelectric layer. The ultra-thin structure helps reduce charge trapping and provides interface engineering such that device performance and endurance are improved. In some embodiments, the semiconductor memory structure may be a memory structure disposed in a front-end-of-line (FEOL) structure or a back-end-of-line (BEOL) interconnect structure. Functionality of the FeFET memory structure is thus further improved.

FIG. 1 is a schematic cross-sectional view of a semiconductor memory structure according to aspects of the present disclosure in one or more embodiments. The semiconductor memory structure 100 includes a gate structure 110, a ferroelectric layer 120, a channel layer 130, a source structure 140S, a drain structure 140D, and an intervening structure 150 between the ferroelectric layer 120 and the channel layer 130. The ferroelectric layer 120 is disposed over the gate structure 110. The channel layer 130 is disposed over the ferroelectric layer 120, and is separated from the ferroelectric layer 120 by the intervening structure 150. The source structure 140S and the drain structure 140D are disposed over the channel layer 130. Further, the source structure 140S and the drain structure 140D are separated from each other.

In some embodiments, the substrate, though not shown, may be any type of semiconductor body (e.g., silicon (Si), silicon germanium (SiGe), silicon-on-insulator (SOI), etc.), such as a semiconductor wafer and/or one or more dies on a wafer, as well as any other type of semiconductor and/or epitaxial layers, associated therewith. In some embodiments, a dielectric structure may be formed over the substrate, though not shown, and the gate structure 110 may be formed in the dielectric structure over the substrate.

In some embodiments, the gate structure 110 may include a conductive material. In some embodiments, the conductive material of the gate structure 110 may have a metal work function that is configured to increase a threshold voltage of the semiconductor memory structure 100, thereby further mitigating a current flowing through the channel layer 130. In some embodiments, the gate structure 110 may include platinum (Pt), titanium (Ti), titanium nitride (TiN), tantalum (Ta), tantalum nitride (TaN), tungsten (W), tungsten nitride (WN), copper (Cu), gold (Au), zinc (Zn), aluminum (Al), iron (Fe), nickel (Ni), beryllium (Be), chromium (Cr), cobalt (Co), antimony (Sb), iridium (Ir), molybdenum (Mo), osmium (Os), thorium (Th), vanadium (V), or a combination thereof. In some embodiments, the gate structure 110 may include a buried gate structure, but the disclosure is not limited thereto. In such embodiments, a top surface of the gate structure 110 may be aligned with (i.e., coplanar with) a top surface of the substrate or a top surface of the dielectric structure, but the disclosure is not limited thereto.

The ferroelectric layer 120 includes a material having dielectric crystals which exhibit an electric polarization having a direction that can be controlled by an electric field. For example, in some embodiments, the ferroelectric layer 120 may include hafnium-oxide ($HfO_2$), hafnium zinc oxide ($HfZnO_2$), zinc oxide (ZnO), or the like. In some embodiments, a thickness of the ferroelectric layer 120 may be between approximately 5 nanometers and approximately 20 nanometers, but the disclosure is not limited thereto. In some embodiments, the ferroelectric layer 120 may be in contact with the gate structure 110. In other embodiments, one or more other layer, such as a buffer layer or a barrier layer, may be disposed between the ferroelectric layer 120 and the gate structure 110, though not shown.

The channel layer 130 includes oxide semiconductor materials. In some embodiments, the oxide semiconductor material may include indium gallium zinc oxide (IGZO), indium gallium zinc tin oxide (IGZTO), indium tungsten oxide (IWO), indium tungsten zinc oxide (IWZO), indium zinc oxide (IZO), zinc oxide (ZnO), or the like. In some embodiments, a thickness of the channel layer 130 may be between approximately 3 nanometers and 20 nanometers, but the disclosure is not limited thereto.

The source structure 140S and the drain structure 140D are disposed over the channel layer 130. The source structure 140S and the drain structure 140D respectively include conductive materials. In some embodiments, the conductive materials includes metals such as TiN and molybdenum (Mo), but the disclosure is not limited thereto. In some embodiments, the source structure 140S and the drain structure 140D include a conductive material same as that of the gate structure 110. In other alternative embodiments, the source structure 140S and the drain structure 140D include a conductive material different from that of the gate structure 110.

In some embodiments, a thickness of the intervening structure 150 is less than the thickness of the ferroelectric layer 120, and less than the thickness of the channel layer 130. In some embodiments, the thickness of the intervening structure 150 is less than 5 angstroms. Both the thickness of the ferroelectric layer 120 and the thickness of the channel layer 130 are greater than approximately 3 nanometers while the thickness of the intervening structure 150 is less than 0.5 nanometer; therefore, the thickness of the intervening structure 150 is much less than the thickness of the ferroelectric layer 120 and the thickness of the channel layer 130. In some embodiments, the intervening structure 150 may be referred to as an ultra-thin structure disposed between the ferroelectric layer 120 and the channel layer 130. In some embodiments, the intervening structure 150 may be referred to as an interface between the ferroelectric layer 120 and the channel layer 130 due to its relatively ultra-thin configuration.

In some embodiments, the intervening structure 150 and the channel layer 130 include different materials. In some embodiments, the material of the intervening structure 150 is further different from that of the ferroelectric layer 120. The materials used to form the intervening structure 150 are described below.

Figure 2A:
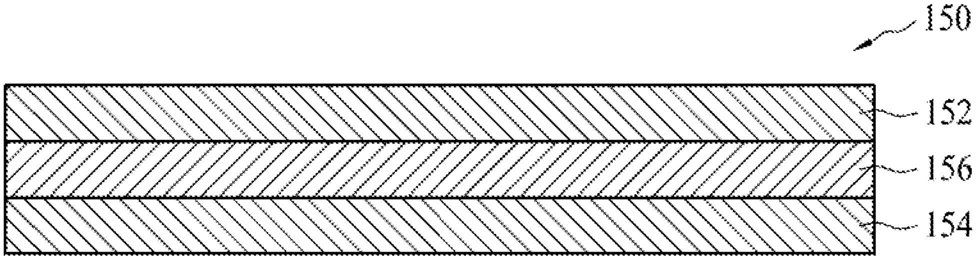
FIG. 2A is a schematic drawing illustrating a portion of the semiconductor memory structure of FIG. 1 according to aspects of the present disclosure in one or more embodiments.

Please refer to FIG. 2A, which is a cross-sectional view of a portion (i.e., the intervening structure 150) of the semiconductor memory structure 100. In some embodiments, the intervening structure 150 is a tri-layered structure. As shown in FIG. 2A, the tri-layered intervening structure 150 includes a first layer 152, a second layer 154 and a third layer 156 between the first layer 152 and the second layer 154. In such embodiments, the first layer 152 is in contact with the channel layer 130, and the second layer 154 is in contact with the ferroelectric layer 120. Further, the first layer 152 and the second layer 154 are separated from each other by the third layer 156, as shown in FIG. 2A. In such embodiments, a sum of a thickness of the first layer 152, a thickness of the second layer 154 and a thickness of the third layer 156 is less than the thickness of the channel layer 130. In other embodiments, the sum of the thickness of the first layer 152, the thickness of the second layer 154 and the thickness of the third layer 156 is also less than the thickness of the ferroelectric layer 120. The thickness of the first layer 152, the thickness of the third layer 156, and the thickness of the second layer 154 have a ratio. In some embodiments, the ratio is between approximately 1:1:1 and approximately 2:1:2, but the disclosure is not limited thereto.

In some embodiments, the intervening structure 150 (i.e., the first layer 152, the second layer 154 and the third layer 156) includes oxide materials. In some embodiments, for example but not limited thereto, the intervening structure 150 includes indium oxide ($In_2O_3$), gallium oxide ($Ga_2O_3$), zinc oxide (ZnO), hafnium oxide ($HfO_2$), zirconium dioxide ($ZrO_2$), aluminum oxide ($Al_2O_3$), silicon oxide ($SiO_2$), tin oxide ($SnO_2$), tungsten oxide ($WO_3$), lanthanum oxide ($La_2O_3$), strontium oxide (SrO), ceric oxide ($CeO_2$), yttrium oxide ($Y_2O_3$), or tantalum oxide ($Ta_2O_5$). Therefore, the first layer 152, the second layer 154 and the third layer 156 are respectively referred to as a first oxide layer 152, a second oxide layer 154 and a third oxide layer 156. In some embodiments, the first oxide layer 152 and the second oxide layer 154 include a same oxide material, while the third oxide layer 156 includes an oxide material different from that of the first oxide layer 152 and the second oxide layer 154. For example but not limited thereto, the first oxide layer 152 and the second oxide layer 154 may include $In_2O_3$, and the third oxide layer 156 includes $Ga_2O_3$. In such embodiments, an $In_2O_3/Ga_2O_3/In_2O_3$ tri-layered intervening structure 150 is provided between the ferroelectric layer 120 and the channel layer 130.

Figure 2B:
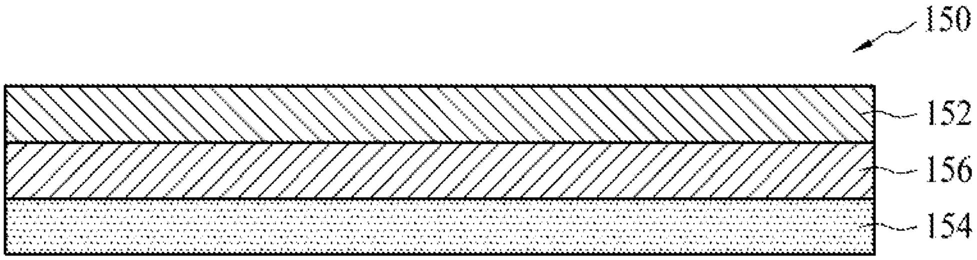
FIG. 2B is a schematic drawing illustrating a portion of the semiconductor memory structure of FIG. 1 according to aspects of the present disclosure in one or more embodiments.

Please refer to FIG. 2B. In some embodiments, the second oxide layer 154 includes an oxide material different from that of the first oxide layer 152, and the third oxide layer 156 includes an oxide material different from those of the first oxide layer 152 and the second oxide layer 154. For example but not limited thereto, the first oxide layer 152 includes $In_2O_3$, the second oxide layer 154 includes ZnO, and the third oxide layer 156 includes $HfO_2$. In such embodiments, an $In_2O_3/HfO_2/ZnO$ tri-layered intervening structure 150 is provided between the ferroelectric layer 120 and the channel layer 130.

When the tri-layered intervening structure 150 is disposed between the ferroelectric layer 120 and the channel layer 130, such arrangement helps reduce charge trapping. As mentioned above, because the thickness of the tri-layered intervening structure 150 is much less than the thickness of the ferroelectric layer 120 and much less than the thickness of the channel layer 130, the tri-layered intervening structure 150 may serve as an interface between the ferroelectric layer 120 and the channel layer 130. Further, influence on the ferroelectric layer 120 and the channel layer 130 by the tri-layered intervening structure 150 is negligible due to its ultra-thin configuration.

Figure 2C:
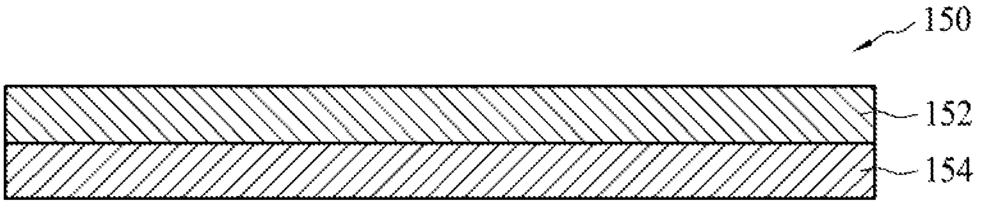
FIG. 2C is a schematic drawing illustrating a portion of the semiconductor memory structure of FIG. 1 according to aspects of the present disclosure in one or more embodiments.

Referring to FIG. 2C, in some embodiments, the intervening structure 150 includes a bi-layered structure. In such embodiments, the intervening structure 150 includes a first oxide layer 152 and a second oxide layer 154 in contact with each other. Further, the first oxide layer 152 is in contact with the channel layer 130, and the second oxide layer 154 is in contact with the ferroelectric layer 120. In such embodiments, a thickness of the first oxide layer 152 and a thickness of the second oxide layer 154 are the same, but the disclosure is not limited thereto. The first oxide layer 152 and the second oxide layer 154 include different materials. In some embodiments, the first oxide layer 152 includes indium oxide, gallium oxide, zinc oxide, hafnium oxide, zirconium oxide, aluminum oxide, silicon oxide, tin oxide, tungsten oxide, lanthanum oxide, strontium oxide, ceric oxide, yttrium oxide, or tantalum oxide. The second oxide layer 154 includes an oxide material selected from the above-mentioned oxide materials but different from the material of the first oxide layer 152. For example, the first oxide layer 152 and the second oxide layer 154 may respectively include $In_2O_3$ and $Ga_2O_3$, $Ga_2O_3$ and $In_2O_3$, $In_2O_3$ and $HfO_2$, $In_2O_3$ and ZnO, ZnO and $In_2O_3$, or other combinations selected from the oxide materials mentioned above.

When the bi-layered intervening structure 150 is disposed between the ferroelectric layer 120 and the channel layer 130, it helps reducing charge trapping. As mentioned above, because the thickness of the bi-layered intervening structure 150 is much less than the thickness of the ferroelectric layer 120 and much less than the thickness of the channel layer 130, the bi-layered intervening structure 150 may serve as an interface between the ferroelectric layer 120 and the channel layer 130. Further, influence on the ferroelectric layer 120 and the channel layer 130 by the bi-layered intervening structure 150 is negligible due to its ultra-thin configuration.

Figure 2D:
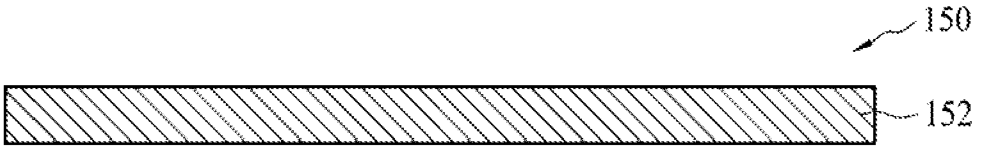
FIG. 2D is a schematic drawing illustrating a portion of the semiconductor memory structure of FIG. 1 according to aspects of the present disclosure in one or more embodiments.

Referring to FIG. 2D, in some embodiments, the intervening structure 150 is a single-layered structure. In other words, the intervening structure 150 may include a single oxide layer 152. In such embodiments, the single-layered structure 150 has a first surface and a second surface opposite to the first surface. The first surface of the single-layered intervening structure 150 is in contact with the channel layer 130, and the second surface of the single-layered intervening structure 150 is in contact with the ferroelectric layer 120.

When the single-layered intervening structure 150 is disposed between the ferroelectric layer 120 and the channel layer 130, such arrangement helps reduce charge trapping. As mentioned above, because a thickness of the single-layered intervening structure 150 is much less than the thickness of the ferroelectric layer 120 and much less than the thickness of the channel layer 130, the single-layered intervening structure 150 may serve as an interface between the ferroelectric layer 120 and the channel layer 130. Further, influence on the ferroelectric layer 120 and the channel layer 130 by the single-layered intervening structure 150 is negligible due to its ultra-thin configuration.

Accordingly, the intervening structure 150 disposed between the ferroelectric layer 120 and the channel layer 130 may be a single-layered, a bi-layered, or a tri-layered structure. The thickness of the intervening structure 150 is less than 5 angstroms, and the influence on the ferroelectric layer 120 and the channel layer 130 is therefore negligible. Further, the intervening structure 150 may serve as an interface between the ferroelectric layer 120 and the channel layer 130. Such interface helps reduce charge trapping in the channel layer 130. Further, the interface helps filling of vacancies in the ferroelectric layer 120 and/or the channel layer 130 and suppression of inter-diffusion of oxygen, hydrogen and vacancies such that the intrinsic fatigue performance and endurance of the ferroelectric layer 120 are improved. The intervening structure 150 further helps tuning band diagram between the ferroelectric layer 120 and the channel layer 130. Accordingly, breakdown strength, memory window and performance of the semiconductor memory structure 100 having the intervening structure 150 between the ferroelectric layer 120 and the channel layer 130 are all improved.

FIGS. 3 to 9B are schematic drawings illustrating semiconductor memory structures 300 to 900_b_ at various fabrication stages constructed according to aspects of the present disclosure in one or more embodiments. Although FIGS. 3 to 9B are described in relation to a method, it will be appreciated that the structures disclosed in FIGS. 3 to 9B are not limited to such method, but instead may stand alone as structures independent of the method.

Figure 3:
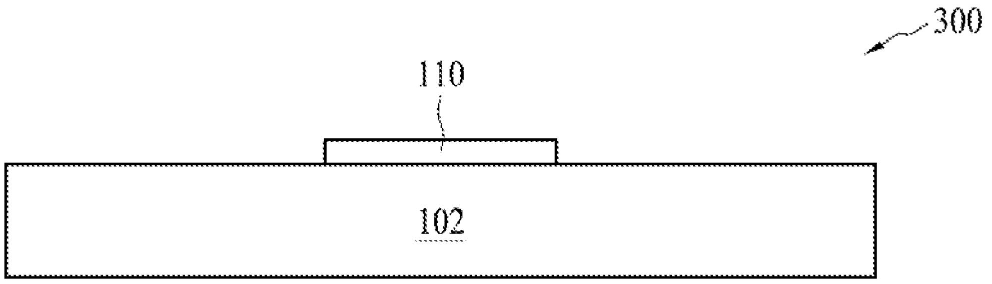
FIGS. 3 to 9B are schematic drawings illustrating a semiconductor memory structure at various fabrication stages constructed according to aspects of the present disclosure in one or more embodiments.

As shown in the cross-sectional view of the semiconductor memory structure 300 of FIG. 3, a gate structure 110 is formed. In some embodiments, the gate structure 110 may be formed over a substrate 102. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, a dielectric structure may be formed over the substrate 102, and the gate structure 110 is formed in the dielectric structure over the substrate 102. The gate structure 110 may include one or more conductive materials. The conductive materials may be same as those described above; thus, repeated descriptions of details are omitted. In various embodiments, the gate structure 110 may be formed by way of one or more deposition processes (e.g., atomic layer deposition (ALD) processes, chemical vapor deposition (CVD) processes, plasma-enhanced chemical vapor deposition (PE-CVD) processes, or the like), and various patterning processes.

Figure 4:
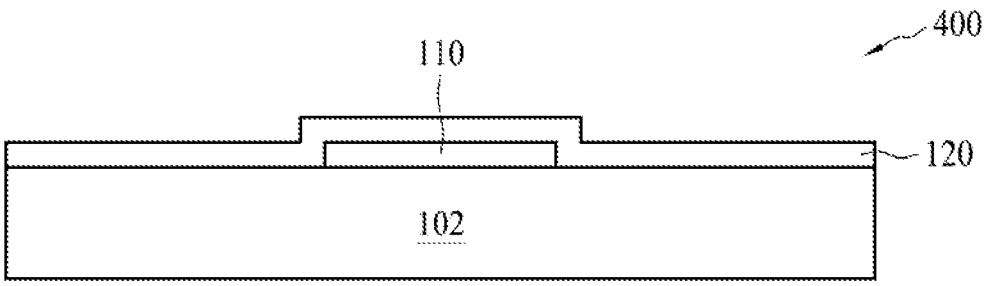

As shown in the cross-sectional view of the semiconductor memory structure 400 of FIG. 4, a ferroelectric layer 120 may be formed over the gate structure 110. The ferroelectric layer 120 may include one or more ferroelectric materials. The ferroelectric materials may be same as those described above; thus, repeated descriptions of details are omitted. In various embodiments, the ferroelectric layer 120 may be formed by way of one or more deposition processes (e.g., ALD processes, CVD processes, PE-CVD processes, or the like).

Figure 5:
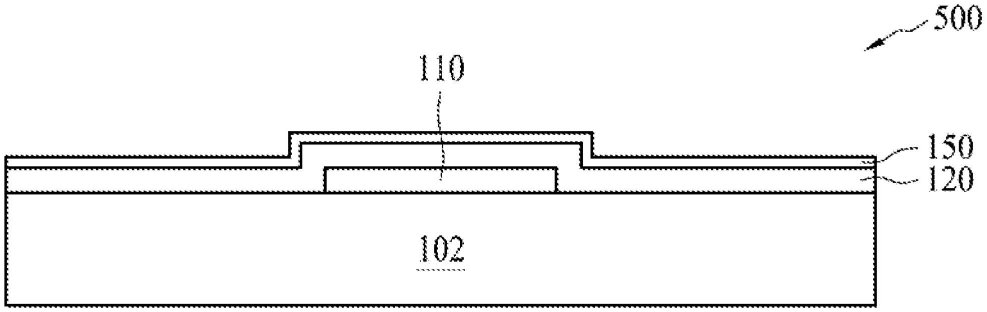

As shown in the cross-sectional view of the semiconductor memory structure 500 of FIG. 5, an intervening structure 150 may be formed over the ferroelectric layer 120. The intervening structure 150 may be a single-layered structure, a bi-layered structure, or a tri-layered structure. A configuration of the intervening structure 150 may be same as those described above; thus, repeated descriptions of details are omitted. In various embodiments, the intervening structure 150 (including, for example, from bottom to top, the second oxide layer 154, the third oxide layer 156 and the first oxide layer 152) may be formed by way of ALD processes, but the disclosure is not limited thereto.

Figure 6:
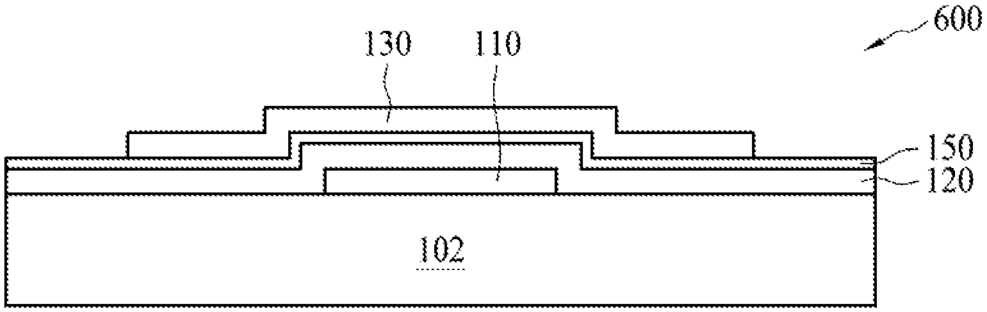

As shown in the cross-sectional view of the semiconductor memory structure 600 of FIG. 6, a channel layer 130 is formed over the intervening structure 150. The channel layer 130 may include one or more oxide semiconductor materials. The oxide semiconductor materials may be same as those described above; thus, repeated descriptions of details are omitted. In various embodiments, the channel layer 130 may be formed by way of one or more deposition processes (e.g., ALD processes, CVD processes, PE-CVD processes, or the like) and various patterning processes.

Figure 7:
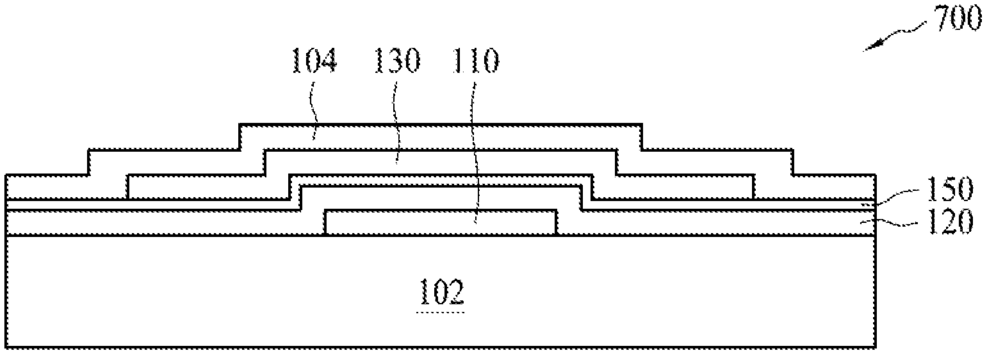

As shown in the cross-sectional view of the semiconductor memory structure 700 of FIG. 7, a dielectric layer 104 is formed over the channel layer 130. In some embodiments, the dielectric layer covers an upper surface and sidewalls of the channel layer 130. The dielectric layer 104 may include one or more dielectric materials. In some embodiments, the dielectric material may include carbide (e.g., silicon carbide, silicon oxycarbide, or the like), a nitride (e.g., silicon nitride, silicon oxynitride, or the like), or the like. In various embodiments, the dielectric layer 104 may be formed by way of one or more deposition processes (e.g., ALD processes, CVD processes, PE-CVD processes, or the like).

Figure 8A:
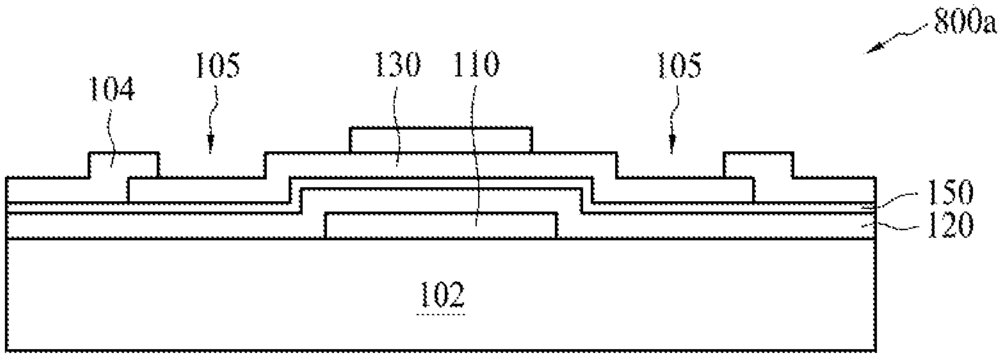
Figure 8B:
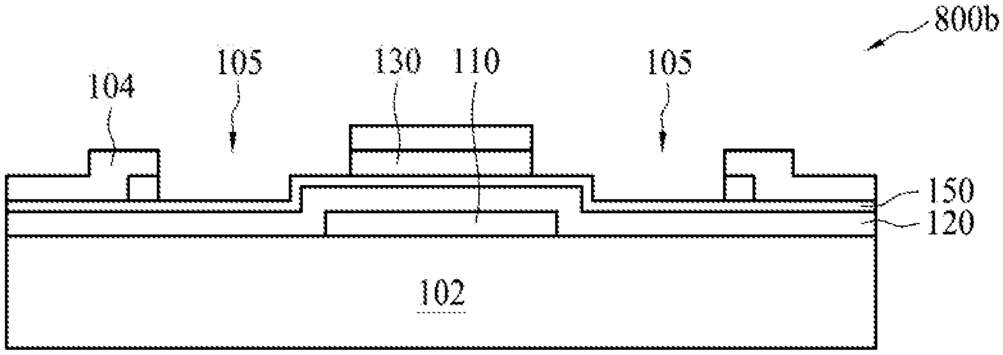

As shown in the cross-sectional view of the semiconductor memory structure 800_a_ in FIG. 8A and the cross-sectional view of the semiconductor memory structure 800_b_ in FIG. 8B, a patterning process is performed to pattern the dielectric layer 104 to form openings 105 for accommodating a source electrode and a drain electrode. In some embodiments, the openings 105 penetrate the dielectric layer 104 and thus portions of the channel layer 130 are exposed thorough bottoms of the openings 105, as shown in FIG. 8A. In other embodiments, the openings 105 penetrate the dielectric layer 104 and the channel layer 130, and thus portions of the channel layer 130 are exposed through sidewalls of the openings 105 while portions of the intervening structure 150 are exposed through bottoms of the openings 105, as shown in FIG. 8B.

Figure 9A:
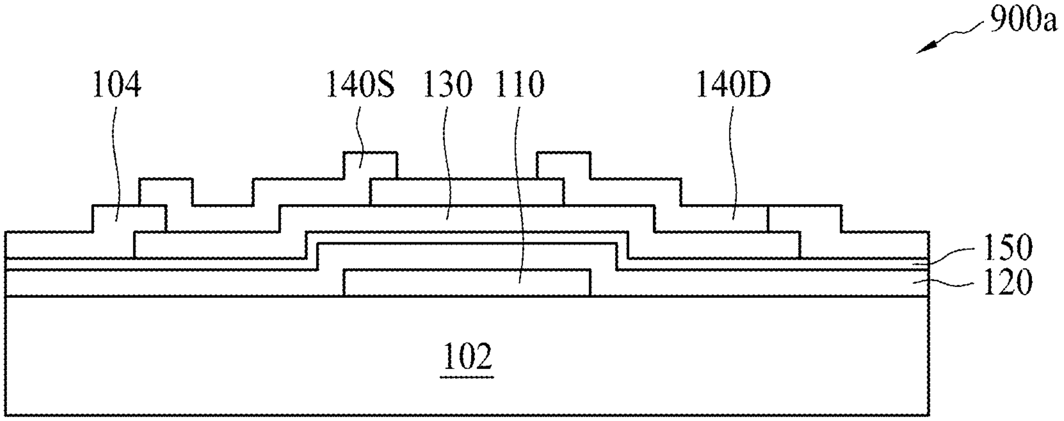
Figure 9B:
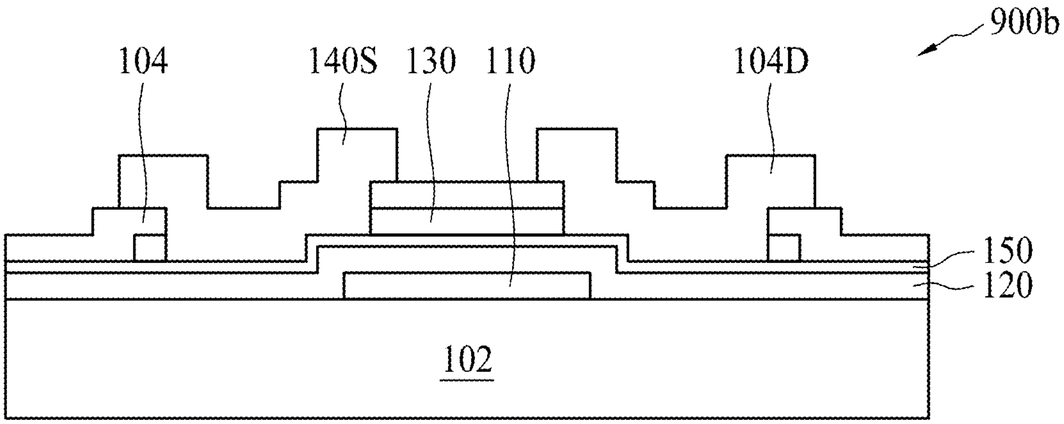

As shown in the cross-sectional view of the semiconductor memory structure 900_a_ of FIG. 9A and the cross-sectional view of the semiconductor memory structure 900_b_ of FIG. 9B, a conductive material is formed within the openings 105. In some embodiments, the conductive material may be same as mentioned above; thus, repeated descriptions of details are omitted. In some embodiments the conductive material may be deposited by one or more of a deposition process and a plating process. In some embodiments, a deposition process may be used to form a seed layer of a conductive material followed by a plating process to fill the openings 105. In some embodiments, after the formation of the conductive material, patterning operations may be performed to form a source structure 140S and a drain structure 140D. In other embodiments, after formation of the conductive material, a planarization process may be performed to remove excess portions of the conductive material from over the dielectric layer and to form the source structure 140S and the drain structure 140D.

Referring to FIG. 9A, in some embodiments, a bottom of the source structure 140S and a bottom of the drain structure 140D are in contact with the channel layer 130. Referring to FIG. 9B, in other embodiments, the bottom of the source structure 140S and the bottom of the drain structure 140D are in contact with the intervening structure 150. Accordingly, the semiconductor memory structure is obtained.

In some embodiments, an interlayer dielectric (ILD) structure (not shown) may be formed over a semiconductor memory structure after formation of a source structure 140S and a drain structure 140D when the semiconductor memory structure is formed by FEOL manufacturing. In such embodiments, connecting structures such as contact plugs or vias may be formed in the ILD structure. The ILD structure may include one or more dielectric layers, and the dielectric layer may include silicon dioxide, silicon nitride, carbon-doped silicon dioxide, silicon oxynitride, borosilicate glass (BSG), phosphorus silicate glass (PSG), borophosphosilicate glass (BPSG), fluorosilicate glass (FSG), undoped silicate glass (USG), a porous dielectric material, or the like.

In other embodiments, an inter-metal dielectric (IMD) structure (not shown) may be formed over the semiconductor memory structure after the forming of the source structure 140S and the drain structure 140D when the semiconductor memory structure is formed by BEOL manufacturing. The IMD structure may include one or more dielectric layers, and the dielectric layer may include silicon oxide, silicon nitride, carbon doped silicon dioxide, BSG, PSG, BPSG, FSG, USG, a porous dielectric material, or the like. In various embodiments, one or more etch stop layers may be formed in the IMD structure, wherein the etch stop layer includes a carbide (e.g., silicon carbide, silicon oxycarbide, or the like), a nitride (e.g., silicon nitride, silicon oxynitride, or the like), or the like. In such embodiments, metal layers may be formed in the IMD structure and may be connected by vias. Thus, a BEOL interconnect structure is obtained with the semiconductor memory structure buried or embedded therein.

Figure 10:
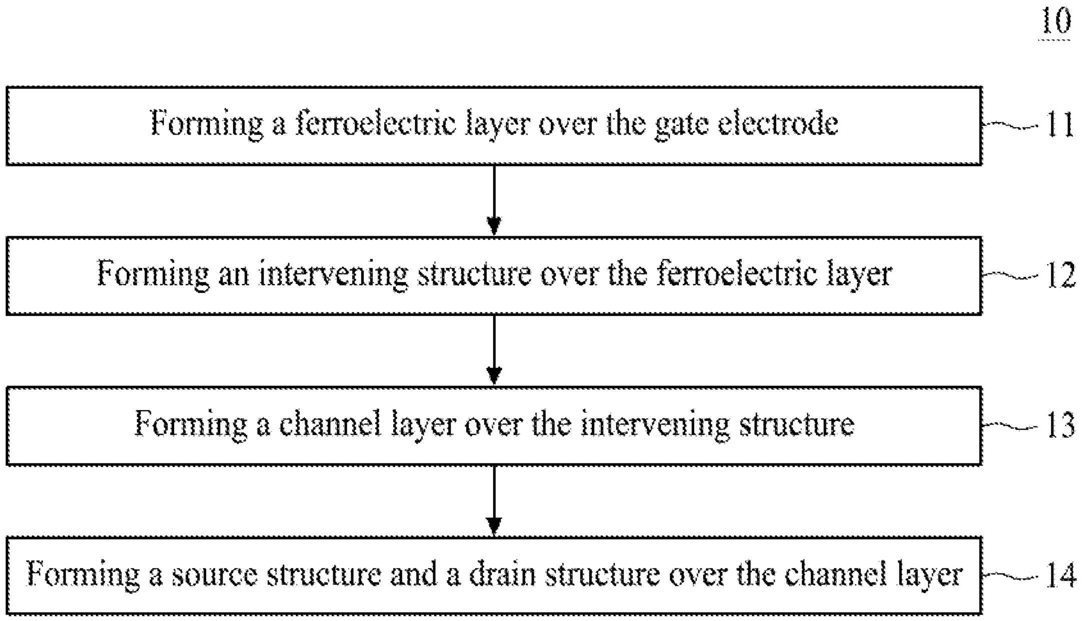
FIG. 10 is a flowchart representing a method for forming a semiconductor memory structure according to aspects of the present disclosure.

FIG. 10 illustrates a flow diagram of some embodiments of a method 10 for forming a semiconductor memory structure.

While the disclosed method 10 is illustrated and described herein as a series of acts or operations, it will be appreciated that an order of the illustrated acts or operations is not to be interpreted in a limiting sense. For example, some operations may occur in different orders and/or concurrently with other acts or operations apart from those illustrated and/or described herein. In addition, not all illustrated operations may be required to implement one or more aspects or embodiments of the description herein. Further, one or more of the operations depicted herein may be carried out in one or more separate operations and/or phases.

In operation 11, a ferroelectric layer is formed on a gate structure. FIG. 4 illustrates a cross-sectional view of the semiconductor memory structure 400 according to some embodiments corresponding to operation 11.

In operation 12, an intervening structure is formed over the ferroelectric layer. FIG. 5 illustrates a cross-sectional view of the semiconductor memory structure 500 according to some embodiments corresponding to operation 12. As shown in FIGS. 2A to 2D, the intervening structure may be a tri-layer structure, a bi-layered structure or a single-layered structure.

In operation 13, a channel layer is formed over the intervening structure. FIG. 6 illustrates a cross-sectional view of the semiconductor memory structure 600 according to some embodiments corresponding to operation 13.

In operation 14, a source structure and a drain structure are formed over the channel layer. FIGS. 9A and 9B illustrate cross-sectional views of the semiconductor memory structures 900*a* and 900*b* according to some embodiments corresponding to operation 14.

Accordingly, the present disclosure provides a semiconductor memory structure and a method for forming the same. In some embodiments, the semiconductor memory structure provides an ultra-thin layer between a channel layer and a ferroelectric layer. The ultra-thin layer helps reduce charge trapping and provides interface engineering such that device performance and endurance are improved. In some embodiments, the semiconductor memory structure may be a memory structure disposed in a front-end-of-line (FEOL) structure or a back-end-of-line (BEOL) interconnect structure. Thus, functionality of a FeFET memory structure is further improved.

In some embodiments, a semiconductor memory structure is provided. The semiconductor memory structure includes a gate structure, a ferroelectric layer over the gate structure, a channel layer over the ferroelectric layer, a first oxide layer and a second oxide layer between the channel layer and the ferroelectric layer, a third oxide layer between the first oxide layer and the second oxide layer, and a source structure and a drain structure over the channel layer. The first oxide layer includes a first oxide material different from a material of the channel layer. A sum of a thickness of the first oxide layer, a thickness of the second oxide layer and a thickness of the third oxide layer is less than a thickness of the channel layer.

In some embodiments, a semiconductor memory structure is provided. The semiconductor memory structure includes a gate structure, a ferroelectric layer over the gate structure, a channel layer over the ferroelectric layer, an intervening structure between the ferroelectric layer and the channel layer, and a source structure and a drain structure separated from each other over the channel layer. A thickness of the intervening structure is less than a thickness of the channel layer and less than a thickness of the ferroelectric layer. The channel layer and the intervening structure include different materials.

In some embodiments, a method for forming a semiconductor memory structure is provided. The method includes following operations. A gate structure is formed over the substrate. A ferroelectric layer is formed over the gate structure. An intervening structure is formed over the ferroelectric layer. A channel layer is formed over the intervening structure. A source structure and a drain structure are formed over the channel layer. A thickness of the intervening structure is less than a thickness of the ferroelectric layer and less than a thickness of the channel layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor memory structure, comprising:

forming a gate structure over a substrate;

forming a ferroelectric layer over the gate structure, wherein the ferroelectric layer is in contact with a top surface and sidewalls of the gate structure;

forming an intervening structure over the ferroelectric layer;

forming a channel layer over the intervening structure; and forming a source structure and a drain structure over the channel layer, wherein a thickness of the intervening structure is less than a thickness of the ferroelectric layer and less than a thickness of the channel layer.

2. The method of claim 1, wherein the intervening structure comprises a single-layered structure, a bi-layered structure or a tri-layered structure.

3. The method of claim 1, wherein the intervening structure comprises a first layer in contact with the channel layer and a second layer in contact with the ferroelectric layer.

4. The method of claim 3, wherein the first layer is in contact with the second layer.

5. The method of claim 4, wherein the first layer and the second layer comprise different materials.

6. The method of claim 3, wherein the first layer and the second layer are separated from each other by a third layer.

7. The method of claim 6, wherein the first layer and the third layer comprise different materials.

8. A method for forming a semiconductor memory structure, comprising:

forming a gate structure over a substrate;

forming a ferroelectric layer over the gate structure, wherein the ferroelectric layer is in contact with a top surface and sidewalls of the gate structure;

forming an intervening structure over the ferroelectric layer;

forming a channel layer over the intervening structure;

forming a dielectric layer over the channel layer, wherein the gate structure is separated from the dielectric layer;

forming openings in the dielectric layer, wherein portions of the channel layer are exposed through the openings; and forming a source structure and a drain structure in the openings, wherein a thickness of the intervening structure is less than a thickness of the ferroelectric layer, and less than a thickness of the channel layer.

9. The method of claim 8, wherein a bottom of the source structure and a bottom of the drain structure are in contact with the channel layer.

10. The method of claim 8, wherein the intervening structure comprises a first layer in contact with the channel layer and a second layer in contact with the ferroelectric layer.

11. The method of claim 10, wherein the first layer is in contact with the second layer, and the first layer and the second layer comprise different materials.

12. The method of claim 10, wherein the first layer and the second layer are separated from each other by a third layer.

13. The method of claim 12, wherein the first layer and the third layer comprise different materials.

14. The method of claim 13, wherein the first layer and the second layer comprise a same material.

15. A method for forming a semiconductor memory structure, comprising:

forming a gate structure over a substrate;

forming a ferroelectric layer over the gate structure, wherein the ferroelectric layer is in contact with a top surface and sidewalls of the gate structure;

forming an intervening structure over the ferroelectric layer;

forming a channel layer over the intervening structure;

forming a dielectric layer over the channel layer, wherein the gate structure is separated from the dielectric layer;

forming openings in the dielectric layer, wherein portions of the intervening structure are exposed through the openings; and forming a source structure and a drain structure in the openings, wherein a thickness of the intervening structure is less than a thickness of the ferroelectric layer and less than a thickness of the channel layer.

16. The method of claim 15, wherein a bottom of the source structure and a bottom of the drain structure are in contact with the intervening structure.

17. The method of claim 15, wherein a sidewall of the source structure and a sidewall of the drain structure are in contact with the channel layer.

18. The method of claim 15, wherein the intervening structure comprises a first layer in contact with the channel layer and a second layer in contact with the ferroelectric layer.

19. The method of claim 18, wherein the first layer is in contact with the second layer, and the first layer and the second layer comprise different materials.

20. The method of claim 18, wherein the first layer and the second layer are separated from each other by a third layer, and the first layer and the third layer comprise different materials.

* * * * *